(12) United States Patent
Shen et al.

(10) Patent No.: US 9,966,986 B1
(45) Date of Patent: May 8, 2018

(54) METHODS FOR CONTROLLING A FREQUENCY SYNTHESIZER CIRCUIT AND A FREQUENCY-GENERATING CIRCUIT UTILIZING THE SAME

(71) Applicant: MEDIATEK INC., Hsin-Chu (TW)

(72) Inventors: Shih-Chi Shen, New Taipei (TW); Shao-Wei Feng, Taipei (TW); Chun-Ming Kuo, Hsinchu (TW); Chi-Hsueh Wang, Kaohsiung (TW); Ang-Sheng Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 15/389,708

(22) Filed: Dec. 23, 2016

(51) Int. Cl.
*H04B 1/18* (2006.01)
*H04B 1/40* (2015.01)
*H04W 52/02* (2009.01)

(52) U.S. Cl.
CPC .......... *H04B 1/40* (2013.01); *H04W 52/0216* (2013.01); *H04W 52/0287* (2013.01)

(58) Field of Classification Search
CPC .... H04B 1/40; H04W 52/00; H04W 52/0261; H04W 52/0287
USPC ...... 455/165.1, 182.1, 183.1, 260, 522, 574, 455/127.1, 127.5, 343.1
See application file for complete search history.

(56) References Cited

U.S. PATENT DOCUMENTS

| | | | |
|---|---|---|---|
| 6,278,864 B1 * | 8/2001 | Cummins | ......... H04W 52/0274 455/260 |
| 6,366,768 B1 * | 4/2002 | Tessier, Jr. | .......... H04W 52/028 455/183.1 |
| 6,473,607 B1 | 10/2002 | Shohara et al. | |
| 7,321,755 B2 * | 1/2008 | Hulvey | ................. G06F 1/3215 370/311 |
| 8,188,782 B1 * | 5/2012 | Lai | ........................... G06F 1/12 327/295 |
| 8,552,804 B1 | 10/2013 | Ren et al. | |

FOREIGN PATENT DOCUMENTS

EP        0937337 A1    8/1999

* cited by examiner

*Primary Examiner* — Sonny Trinh
(74) *Attorney, Agent, or Firm* — McClure, Qualey & Rodack, LLP

(57) ABSTRACT

A frequency-generating circuit includes a frequency synthesizer circuit and a controller. The frequency synthesizer circuit generates a radio-frequency clock signal according to a reference clock signal and a channel number. The controller is coupled to the frequency synthesizer circuit, generates a power-down control signal for controlling at least a portion of the frequency synthesizer circuit to power down. The frequency synthesizer circuit includes an accumulator for generating an accumulated value according to the channel number. The frequency synthesizer circuit generates the radio-frequency clock signal according to the reference clock signal and the accumulated value. The controller maintains the accumulated value of the accumulator when the portion of the frequency synthesizer circuit powers down.

18 Claims, 13 Drawing Sheets

US 9,966,986 B1

METHODS FOR CONTROLLING A FREQUENCY SYNTHESIZER CIRCUIT AND A FREQUENCY-GENERATING CIRCUIT UTILIZING THE SAME

BACKGROUND OF THE INVENTION

Field of the Invention

The invention relates to a frequency-generating circuit and methods for controlling a frequency synthesizer circuit of the frequency-generating circuit.

Description of the Related Art

A wireless device may transmit and receive data for communication with a wireless communication system. The wireless device may include a transmitter for data transmission and a receiver for data reception. The transmitter and receiver may be integrated as a transceiver. For data transmission, the transmitter may modulate a transmit local oscillator (LO) signal with data to obtain a modulated radio frequency (RF) signal, amplify the modulated RF signal to obtain an output RF signal having the proper output power level, and transmit the output RF signal via an antenna to a base station. For data reception, the receiver may obtain a received RF signal via the antenna, amplify and down-convert the received RF signal with a received LO signal, and process the down-converted signal to recover data sent by the base station.

The wireless device may include a frequency synthesizer to generate a signal oscillating at a desired frequency for the transceiver. The frequency synthesizer may have a great impact on the performance of the transceiver.

BRIEF SUMMARY OF THE INVENTION

Frequency-generating circuit and a method for controlling a frequency synthesizer circuit are provided. An exemplary embodiment of a frequency-generating circuit comprises a frequency synthesizer circuit and a controller. The frequency synthesizer circuit generates a radio-frequency clock signal according to a reference clock signal and a channel number. The controller is coupled to the frequency synthesizer circuit. The controller generates a power-down control signal for controlling at least a portion of the frequency synthesizer circuit to power down. The frequency synthesizer circuit comprises an accumulator for generating an accumulated value according to the channel number. The frequency synthesizer circuit generates the radio-frequency clock signal according to the reference clock signal and the accumulated value. The controller maintains the accumulated value of the accumulator when the portion of the frequency synthesizer circuit powers down.

An exemplary embodiment of a method for controlling a frequency synthesizer circuit of a frequency-generating circuit comprised in a communications apparatus for reducing power consumption of the communications apparatus, comprising: generating a power-down control signal by the controller of the communications apparatus for controlling at least a portion of the frequency synthesizer circuit to power down, wherein the frequency synthesizer circuit comprises an accumulator for generating an accumulated value according to a channel number, and the frequency synthesizer circuit generates a radio-frequency clock signal according to a reference clock signal and the accumulated value; and maintaining the accumulated value of the accumulator by the controller when the portion of the frequency synthesizer circuit powers down.

An exemplary embodiment of a method for reducing power consumption for a communications apparatus having a frequency synthesizer circuit comprises: configuring the frequency synthesizer circuit to operate in a normal power period, wherein an amount of power consumption of the frequency synthesizer circuit is in a first power level when operating in the normal power period; and configuring the frequency synthesizer circuit to operate in a power saving period wherein an amount of power consumption of the frequency synthesizer circuit is in a second power level when operating in the power saving period for reducing power consumption. The second power level is less than the first power level.

Another exemplary embodiment of a method for reducing power consumption for a communications apparatus having a frequency synthesizer circuit comprises: configuring the frequency synthesizer circuit to generate a first clock signal when operating in a normal power period; and configuring the frequency synthesizer circuit not to generate the first clock signal when operating in a power saving period for reducing power consumption.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
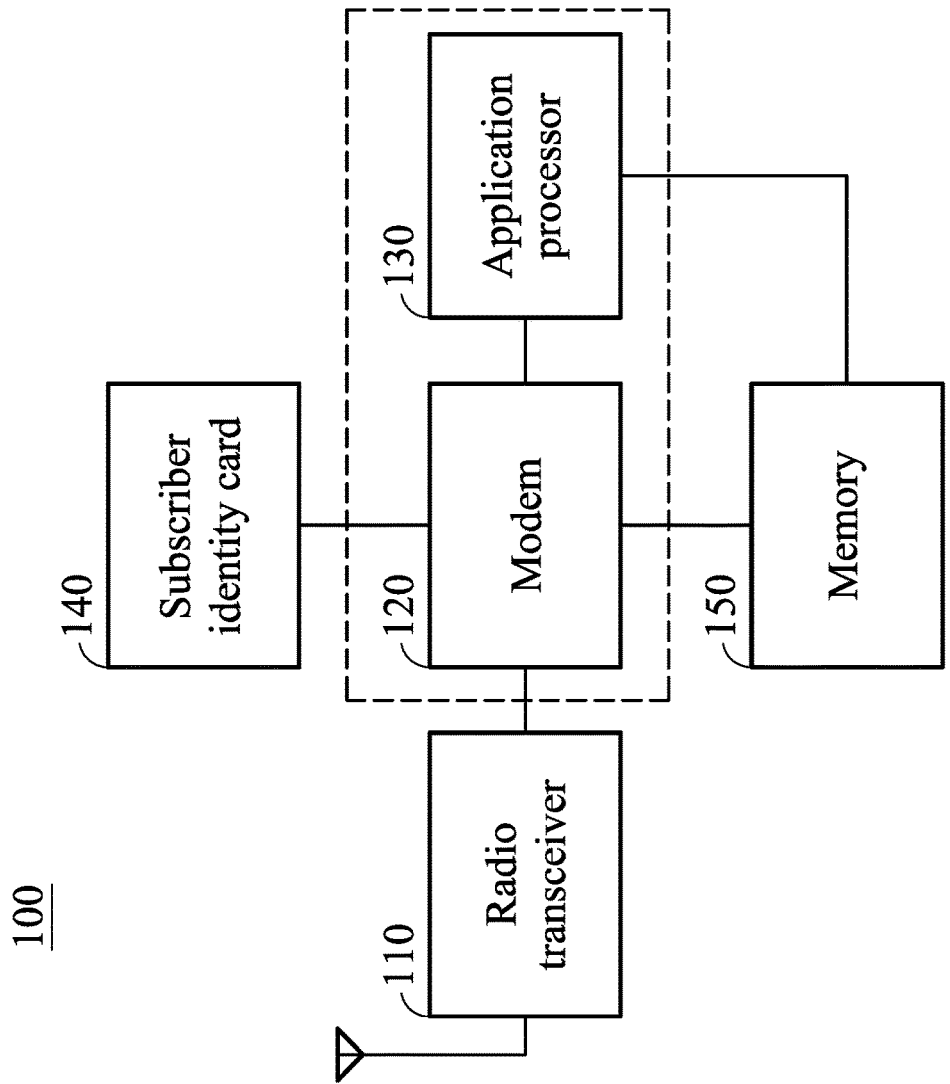
FIG. 1 shows an exemplary block diagram of a communications apparatus according to an embodiment of the invention.

FIG. 1 shows an exemplary block diagram of a communications apparatus according to an embodiment of the invention. The communications apparatus 100 may be a portable electronic device, such as a Mobile Station (MS, which may be interchangeably referred to as User Equipment (UE)). The communications apparatus 100 may comprise at least an antenna module comprising at least one antenna, a radio transceiver 110, a modem 120, an application processor 130, a subscriber identity card 140, and a memory 150. The radio transceiver 110 may receive wireless radio frequency signals via the antenna module, transmit wireless radio frequency signals via the antenna module, and perform RF signal processing. For example, the radio transceiver 110 may convert the received signals to intermediate frequency (IF) or baseband signals to be processed, or receive the IF or baseband signals from the modem 120 and convert the received signals to wireless radio frequency signals to be transmitted to a network device. According to an embodiment of the invention, the network device may be a cell, an evolved node B, a base station, a Mobility Management Entity (MME) etc., at the network side and communicating with the communications apparatus 100 via the wireless radio frequency signals.

The radio transceiver 110 may comprise a plurality of hardware devices to perform radio frequency conversion and RF signal processing. For example, the radio transceiver 110 may comprise a power amplifier circuit for amplifying the RF signals, a filter circuit for filtering unwanted portion in the RF signals, a frequency synthesizer circuit for generating a signal oscillating at a desired radio frequency and/or a mixer circuit for performing radio frequency conversion. According to an embodiment of the invention, the radio frequency may be, for example, 900 MHz or 1800 MHz for a Global System for Mobile communication (GSM), or 1900 MHz for a Universal Mobile Telecommunications System (UMTS), or the frequency of any specific frequency band for a Long-Term Evolution (LTE) system, etc.

The modem 120 may be a cellular communications modem configured for handling cellular system communications protocol operations and processing the IF or baseband signals received from, or to be transmitted to, the radio transceiver 110. The application processor 130 is configured for running the operating system of the communications apparatus 100 and running application programs installed in the communications apparatus 100. In the embodiments of the invention, the modem 120 and the application processor 130 may be designed as discrete chips with some buses or hardware interfaces coupled therebetween, or they may be integrated into a combo chip (i.e., a system on chip (SoC)), and the invention should not be limited thereto.

The subscriber identity card 140 may be a SIM, USIM, R-UIM or CSIM card, or the like and may typically contain user account information, an International Mobile Subscriber Identity (IMSI) and a set of SIM application toolkit (SAT) commands, and it may provide storage space for phone book contacts. The memory 150 may be coupled to the modem 120 and application processor 130 and may store system data or user data.

Note that, in order to clarify the concept of the invention, FIG. 1 presents a simplified block diagram in which only the elements relevant to the invention are shown. For example, in some embodiments of the invention, the communications apparatus may further comprise some peripheral devices not shown in FIG. 1. In another example, in some embodiments of the invention, the communications apparatus may further comprise a central controller coupled to the modem 120 and the application processor 130. Therefore, the invention should not be limited to what is shown in FIG. 1.

Note further that although FIG. 1 shows a single-card single-standby application, the invention should not be limited thereto. For example, in some embodiments of the invention, the communications apparatus may comprise multiple subscriber identity cards to support multiple radio access technologies (RATs) communications. In the multiple RATs communications applications, the modem, the radio transceiver and/or the antenna module may be shared by the subscriber identity cards and may have the capability of handling the operations of multiple cellular system communications protocols and processing the corresponding RF, IF or baseband signals in compliance with multiple cellular system communications protocols. Those who are skilled in this technology can still make various alterations and modifications based on the descriptions given above to derive the communications apparatuses comprising multiple radio transceivers and/or multiple antenna modules for supporting multiple RAT wireless communications without departing from the scope and spirit of this invention. Therefore, in some embodiments of the invention, the communications apparatus may be designed to support a multi-card multi-standby application by making some alterations and modifications.

Note further that the subscriber identity card 140 may be dedicated hardware cards as described above, or in some embodiments of the invention, there may be individual identifiers, numbers, addresses, or the like which are burned in the internal memory of the corresponding modem and are capable of identifying the communications apparatus. Therefore, the invention should not be limited to what is shown in the figures.

Figure 2:
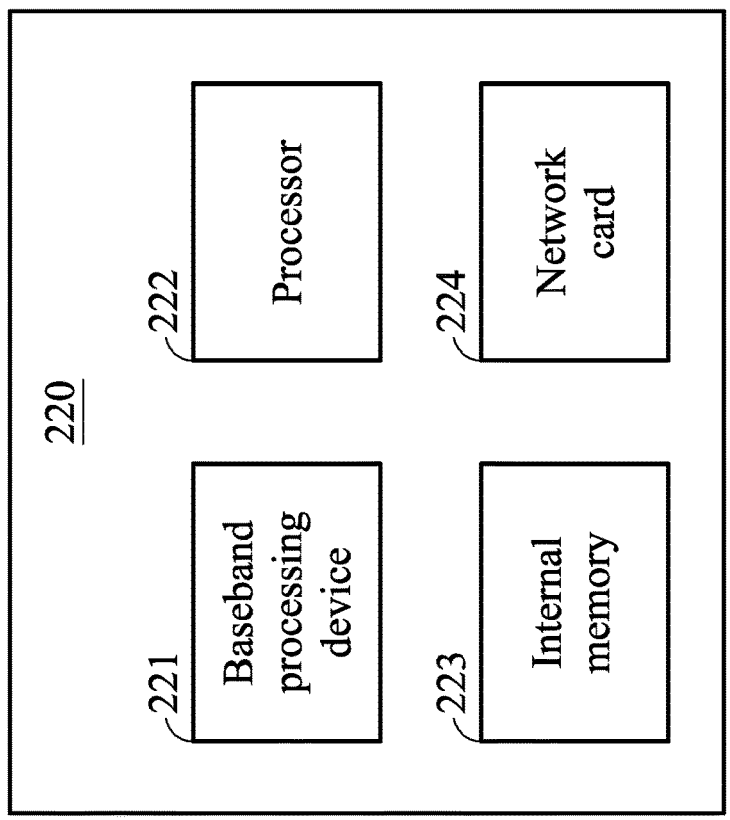
FIG. 2 shows an exemplary block diagram of a modem according to an embodiment of the invention.

FIG. 2 shows an exemplary block diagram of a modem according to an embodiment of the invention. The modem 220 may be the modem 120 shown in FIG. 1 and may comprise at least a baseband processing device 221, a processor 222, an internal memory 223 and a network card 224. The baseband processing device 221 may receive the IF or baseband signals from the radio transceiver 110 and perform IF or baseband signal processing. For example, the baseband processing device 221 may convert the IF or baseband signals to a plurality of digital signals, and process the digital signals, and vice versa. The baseband processing device 221 may comprise a plurality of hardware devices to perform signal processing, such as an analog-to-digital converter circuit for ADC conversion, a digital-to-analog converter circuit for DAC conversion, an amplifier circuit for gain adjustment, a modulator circuit for signal modulation, a demodulator circuit for signal demodulation, a encoder circuit for signal encoding, a decoder circuit for signal decoding, and so on.

The processor 222 may control the operations of the modem 220. According to an embodiment of the invention, the processor 222 may be arranged to execute the program codes of the corresponding software module of the modem 220. The processor 222 may maintain and execute the individual tasks, threads, and/or protocol stacks for different software modules. In a preferred embodiment, a protocol stack may be implemented so as to respectively handle the radio activities of one RAT. However, it is also possible to implement more than one protocol stack to handle the radio activities of one RAT at the same time, or implement only one protocol stack to handle the radio activities of more than one RAT at the same time, and the invention should not be limited thereto.

The processor 222 may also read data from the subscriber identity card coupled to the modem, such as the subscriber identity card 140, and write data to the subscriber identity card. The internal memory 223 may store system data and user data for the modem 220. The processor 222 may also access the internal memory 223.

The network card 224 provides Internet access services for the communications apparatus. Note that although the network card 224 shown in FIG. 2 is configured inside of the modem, the invention should not be limited thereto. In some embodiments of the invention, the communications apparatus may also comprise a network card configured outside of the modem, or the communications apparatus may also be coupled to an external network card for providing Internet access services. Therefore, the invention should not be limited to any specific implementation method.

Note further that, in order to clarify the concept of the invention, FIG. 2 presents simplified block diagrams in which only the elements relevant to the invention are shown. Therefore, the invention should not be limited to what is shown in FIG. 2.

Note further that in some embodiments of the invention, the modem may comprise more than one processor and/or more than one baseband processing device. For example, the modem may comprise multiple processors and/or multiple baseband processing devices for supporting multi-RAT operations. Therefore, the invention should not be limited to what is shown in FIG. 2.

Figure 3:
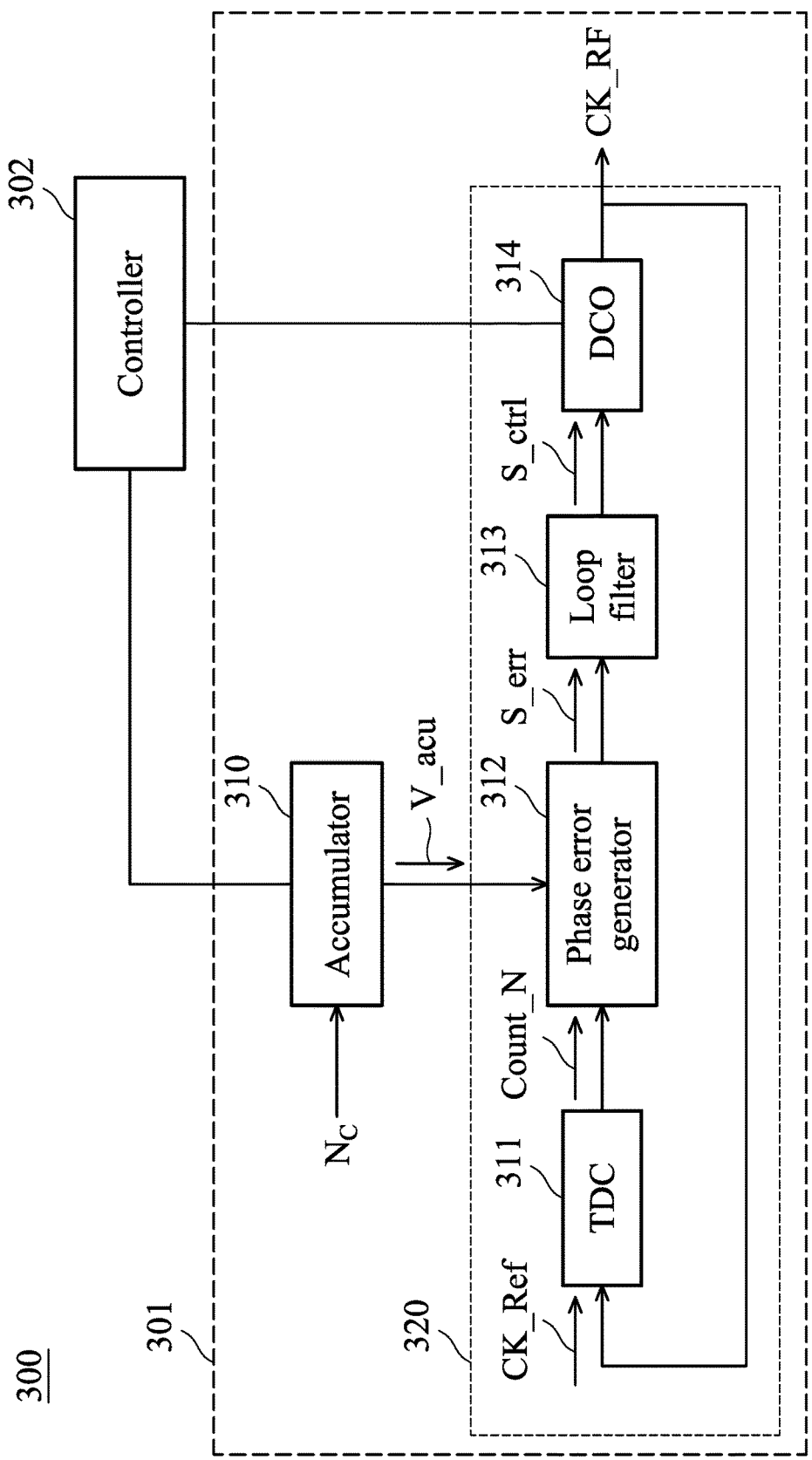
FIG. 3 shows an exemplary block diagram of a frequency-generating circuit comprised in the communications apparatus according to an embodiment of the invention.

FIG. 3 shows an exemplary block diagram of a frequency-generating circuit comprised in the communications apparatus according to an embodiment of the invention. The frequency-generating circuit 300 may be comprised in the radio transceiver 110 of the communications apparatus. According to an embodiment of the invention, the frequency-generating circuit 300 may comprise a frequency synthesizer circuit 301 and a controller 302. The frequency synthesizer circuit 301 generates a radio frequency (RF) clock signal CK_RF according to a reference clock signal CK_Ref and a channel number Nc. The channel number Nc represents a ratio of the frequency of the RF clock signal CK_RF to the frequency of the reference clock signal CK_Ref.

The frequency synthesizer circuit 301 may comprise an accumulator 310 and a signal processing chain 320. The accumulator 310 generates an accumulated value V_acu according to the channel number Nc. The signal processing chain 320 comprises a plurality of signal-generating circuits and generates the RF clock signal CK_RF according to the reference clock signal CK_Ref and the accumulated value V_acu.

According to an embodiment of the invention, the frequency synthesizer circuit 301 may be an all-digital phase locked loop (ADPLL). For example, as shown in FIG. 3, the frequency synthesizer circuit 301 may comprise the signal-generating circuits, such as a time to digital converter (TDC) 311, a phase error generator 312, a loop filter 313 and a digitally controlled oscillator (DCO) 314. The TDC 311 accumulates the number of rising edges of the RF clock signal CK_RF within the operating period before the sampled rising edge of the reference clock signal CK_Ref and outputs the counted number Count_N at the rising edges of the reference clock signal CK_Ref. The accumulator 310 operates based on the reference clock signal CK_Ref and outputs the accumulated value V_acu at the rising edges of the reference clock signal CK_Ref. The phase error generator 312 receives the counted number Count_N of the TDC 311 and the accumulated value V_acu of the accumulator 310 and compares the difference between the counted number Count_N and the accumulated value V_acu to generate a phase error signal S_err. The loop filter 313 filters the phase error signal S_err to generate a control signal S_ctrl. The DCO 314 receives the control signal S_ctrl and generates the RF clock signal CK_RF according to the control signal S_ctrl.

The ADPLL operates in the true phase domain by comparing the variable phase of the DCO with the reference phase of the reference clock signal CK_Ref of high long-term precision. The comparison result is a digital phase error which, after being filtered by the digital loop filter, adjusts the DCO frequency in the negative feedback manner.

According to an embodiment of the invention, the accumulated value V_acu comprises phase information of the frequency synthesizer circuit and is positively related to the reference phase $\varphi_{Ref}$.

Figure 4:
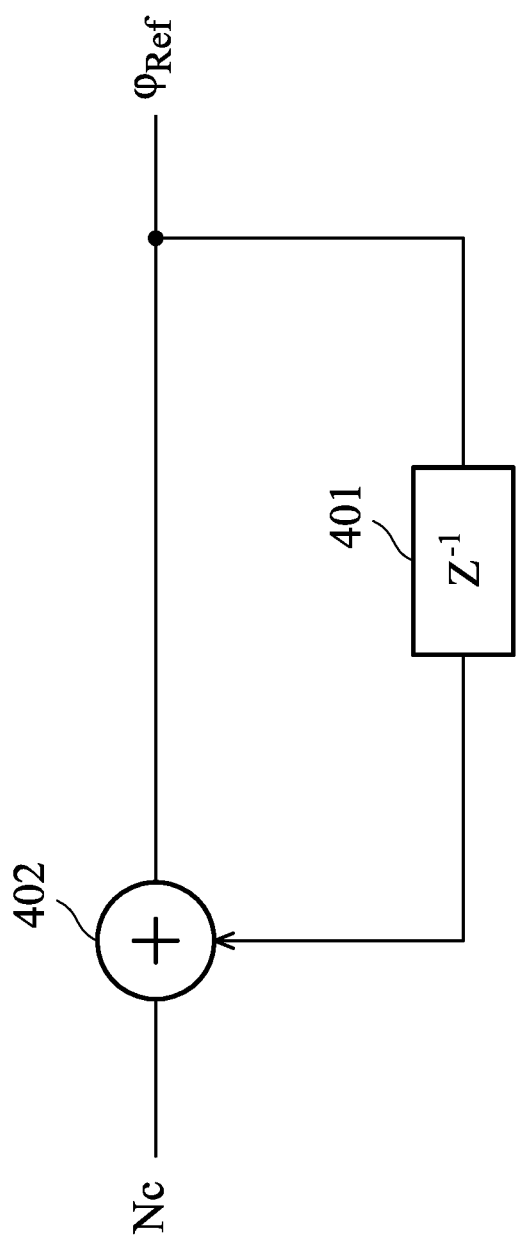
FIG. 4 shows an exemplary circuit diagram of an accumulator according to an embodiment of the invention.

FIG. 4 shows an exemplary circuit diagram of an accumulator according to an embodiment of the invention. The accumulator 400 may comprise a register 401 to store the phase information and an adder 402. The adder 402 accumulates the received channel number Nc to generate the accumulated value V_acu. The register 401 stores the accumulated value V_acu, which in this embodiment is the reference phase $\varphi_{Ref}$.

Note that although in the embodiment shown in FIG. 3, the frequency synthesizer circuit 301 is implemented as a multi modulus divider (MMD)-less ADPLL, the invention should not be limited thereto. In some other embodiments of the invention, the frequency synthesizer circuit 301 may also be implemented as an MMD ADPLL, an analog PLL, or any other type of PLL.

According to an embodiment of the invention, when the frequency synthesizer circuit 301 is a multi modulus divider (MMD)-less ADPLL, the accumulator 310 is an integrator in the MMD-less ADPLL. According to another embodiment of the invention, when the frequency synthesizer circuit 301 is a MMD ADPLL, the accumulator 310 is a sigma delta modulation (SDM) accumulator in the MMD ADPLL.

Figure 5:
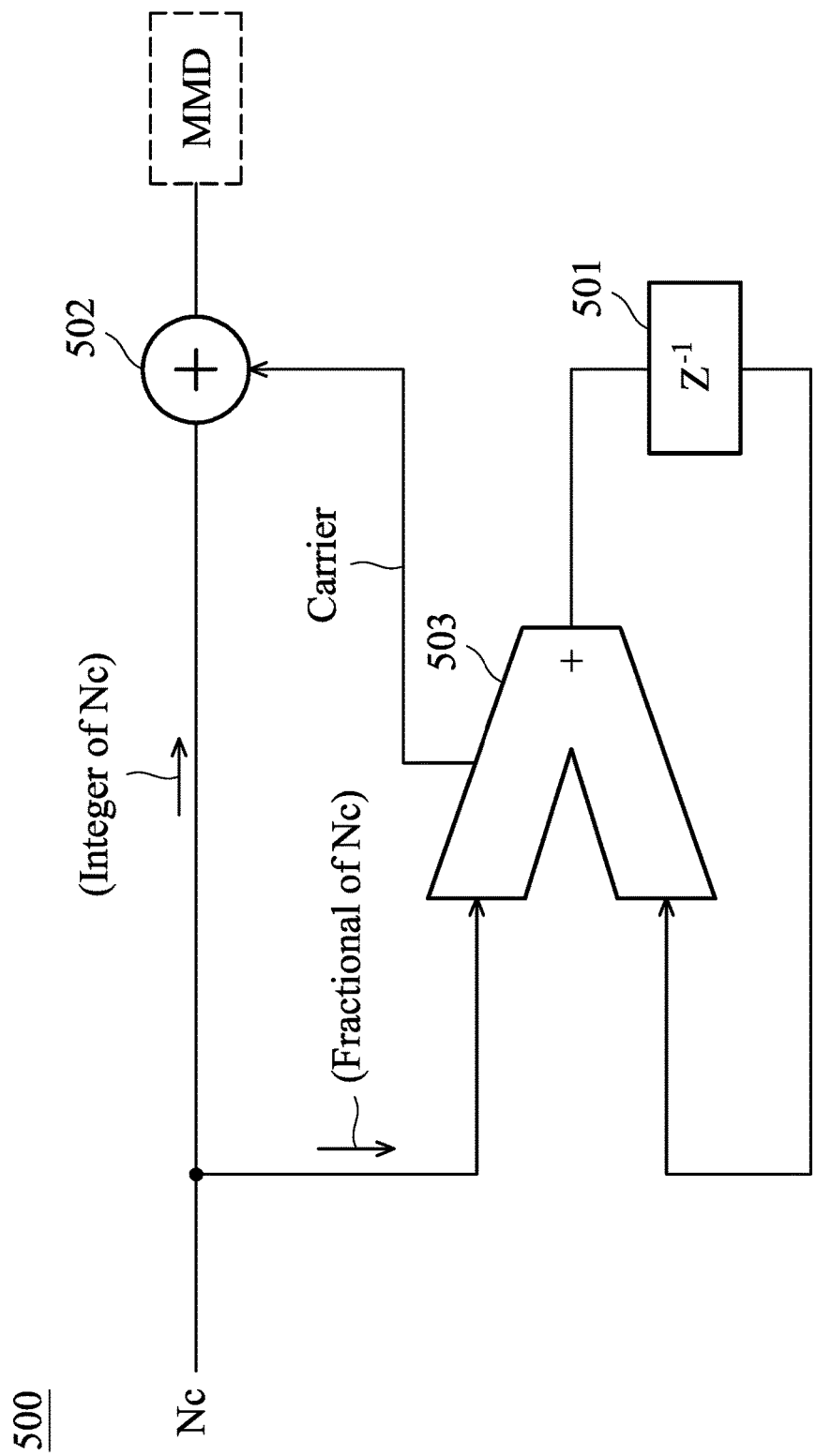
FIG. 5 shows an exemplary circuit diagram of an accumulator according to another embodiment of the invention.

FIG. 5 shows an exemplary circuit diagram of an accumulator according to another embodiment of the invention. The accumulator 500 is a first-order sigma delta modulation (SDM) accumulator, and is usually implemented in an MMD ADPLL. The accumulator 500 may comprise a register 501 to store the phase information, an adder 502 and an accumulator 503. The integer part and fractional part of the channel number Nc will be separated in this structure. The adder 502 adds the integer part of the channel number Nc and the carrier of the accumulation result of the accumulator 503. The accumulator 503 accumulates the fractional part of the channel number Nc. The register 501 stores the accumulated value of the accumulator 503 as the phase information.

Figure 6A:
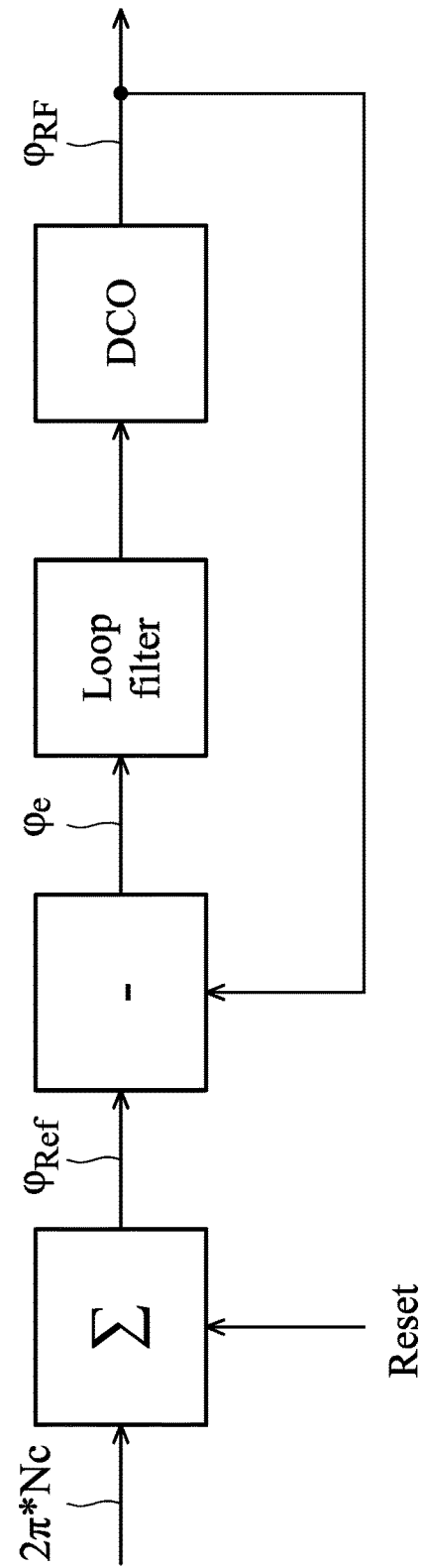
FIG. 6A is a simplified diagram showing the phase domain operation of the frequency synthesizer circuit according to an embodiment of the invention.

FIG. 6A is a simplified diagram showing the phase domain operation of the frequency synthesizer circuit as shown in FIG. 3 according to an embodiment of the invention. The reference phase $\varphi_{Ref}$ is obtained by accumulating the phase of $2\pi*Nc$ ($\varphi_{Ref}=\varphi_{Ref}+2\pi*Nc$). The RF clock phase $\varphi_{RF}$ is fed back to be compared with the reference phase $\varphi_{Ref}$ to obtain the phase error $\varphi_e$.

Figure 6B:
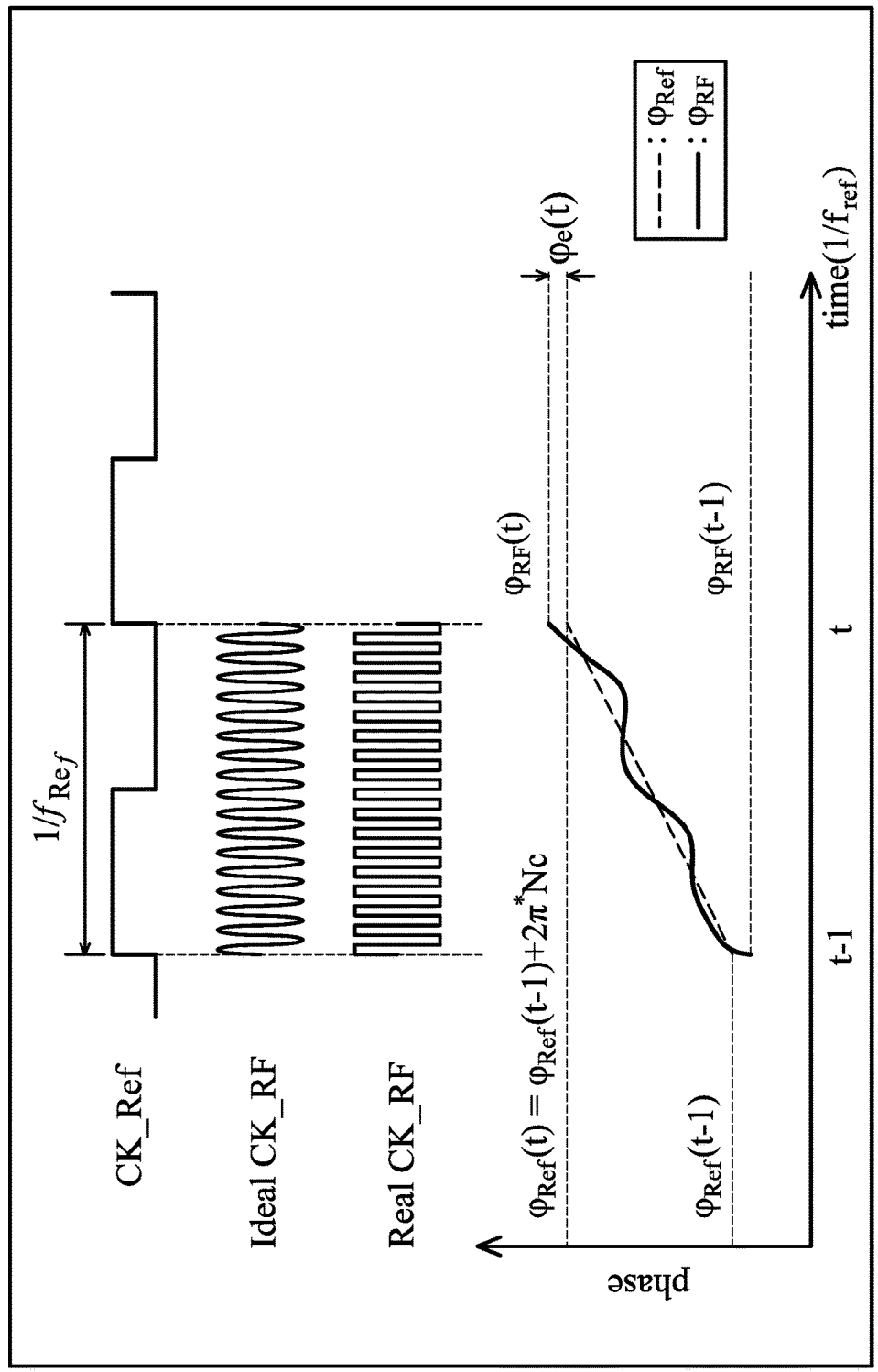
FIG. 6B shows exemplary waveforms of the reference clock signal CK_Ref and the RF clock signal CK_RF according to an embodiment of the invention.

FIG. 6B shows exemplary waveforms of the reference clock signal CK_Ref and the RF clock signal CK_RF according to an embodiment of the invention. In this embodiment, the length of one reference clock cycle duration is $1/f_{Ref}$, where $f_{Ref}$ is the frequency of the reference clock signal CK_Ref. As shown in FIG. 6B, a reference clock cycle begins from time (t−1) till time t. The ideal RF clock signal CK_RF runs Nc (i.e. the channel number) cycles within the reference clock cycle from time (t−1) till time t. Therefore, the reference phase $\omega_{Ref}(t)$ at time t can be derived as $\varphi_{Ref}(t)=\varphi_{Ref}(t-1)+2\pi*Nc$.

Figure 6C:
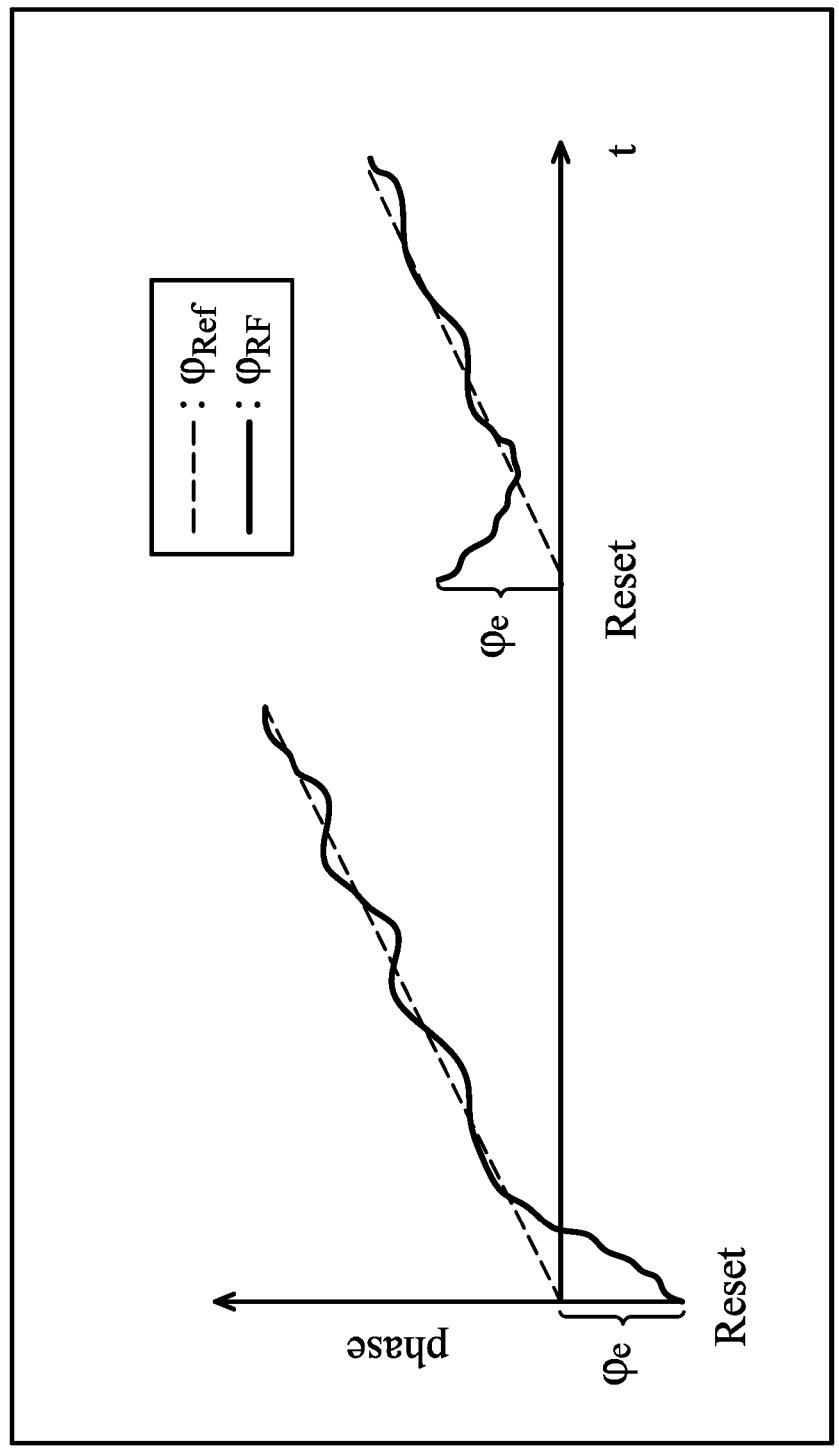
FIG. 6C shows the exemplary phase error $\varphi_e$ according to an embodiment of the invention.

FIG. 6C shows an exemplary phase error $\varphi_e$ according to an embodiment of the invention. As shown in FIG. 6C, through the negative feedback loop of the frequency synthesizer circuit, the phase error $\varphi_e$ can gradually converge, and the RF clock phase $\varphi_{RF}$ and the reference phase $\varphi_{Ref}$ can finally align. Note that the "Reset" here represents the reset operation performed on the accumulator. As shown in FIG. 6C, every time the accumulator is reset, the accumulated value is reset to zero, or any random value, and the phase information will be lost. In this manner, the RF clock phase $\varphi_{RF}$ and the reference phase $\varphi_{Ref}$ have to re-align.

Since the frequency synthesizer circuit may have a great impact on the performance of the transceiver, in a conventional design, the frequency synthesizer circuit will never be shut down so that the accumulator will not be reset, even in the unused period, to avoid the phase incoherence problem.

However, power consumption has become an important issue nowadays, especially when manufacturing a communications-apparatus product. In order to reduce the power consumption of the communications apparatus without affecting the phase coherency of the frequency synthesizer circuit, a novel design of the frequency-generating circuit and the controlling methods thereof are provided.

According to an embodiment of the invention, the controller 302 in the frequency-generating circuit 300 may generate a power-down control signal for controlling at least a portion of the frequency synthesizer circuit 301 to power down (or, shut down) in a sleep period, and may generate a power-on control signal for controlling the portion of the frequency synthesizer circuit 301 to power on (or, wake up) in a wake up period. The sleep period may be the unused period during which the frequency synthesizer circuit does not have to output the RF clock signal CK_RF, since the communications apparatus does not have to perform any transmission or reception. The wake up period may be the used period during which the frequency synthesizer circuit has to output the RF clock signal CK_RF. For example, when the network device transmits data to the communications apparatus in discontinuous segments, the communications apparatus may perform the corresponding reception discontinuously. The communications apparatus may wake up and receive data for the period of time during which the discontinuous segments arrive, and then go to sleep for a sleep period. During the sleep period, the communications apparatus may operate in a low power mode to power down all or part of the frequency synthesizer circuit to reduce power consumption.

In order to reduce the power consumption of the communications apparatus without affecting the phase coherency of the frequency synthesizer circuit 301, the controller 302 may maintain the accumulated value V_acu of the accumulator 310 when the portion of the frequency synthesizer circuit powers down in response to the power-down control signal during the sleep period.

According to an embodiment of a first aspect of the invention, the controller 302 may maintain the accumulated value V_acu of the accumulator 310 by not providing the power-down control signal to the accumulator 310 for the accumulator 310 to be able to keep functioning while at least one signal-generating circuit powers down (or shuts down) in response to the power-down control signal. To be more specific, the frequency synthesizer circuit will not output the RF clock signal CK_RF in the sleep period when the controller 302 provides the power-down control signal to at least one signal-generating circuit, such as the DCO 314 for example, to control the DCO 314 to power down in the sleep period. However, in the embodiment of the invention, the controller 302 will not provide the power-down control signal to the accumulator 310 for the accumulator 310 to be able to keep functioning. In this manner, the accumulator 310 may keep accumulating even when the other portion of the frequency synthesizer circuit goes to sleep, and the phase information stored in the register (such as the register 401 as shown in FIG. 4, or the register 501 as shown in FIG. 5 when the frequency synthesizer circuit is implemented as an MMD ADPLL) can be kept and will not be lost.

According to an embodiment of a second aspect of the invention, the controller 302 may also provide the power-down control signal to the accumulator 310 for controlling the accumulator to power down in the sleep period. In the sleep period, the frequency synthesizer circuit does not output the RF clock signal CK_RF. The controller 302 may maintain the accumulated value V_acu of the accumulator 301 by reading the register (such as the register 401 as shown in FIG. 4, or the register 501 as shown in FIG. 5 when the frequency synthesizer circuit is implemented as an MMD ADPLL) of the accumulator 310 to obtain a current accumulated value when providing the power-down control signal to the accumulator. That is, the controller 302 may obtain the final accumulated value before the accumulator 310 powers down. The controller 302 may further estimate a future accumulated value which is supposed to be obtained by the accumulator 310 at the end of the sleep period and write the future accumulated value back to the register.

In this manner, the phase information stored in the register can be restored.

According to an embodiment of the invention, the controller 302 may estimate the future accumulated value according to the current accumulated value, the length of the reference clock cycle duration of the reference clock signal CK_Ref and the length of the sleep period.

Using the operation shown in FIG. 6A as an example, and supposing that the current accumulated value (that is, the final accumulated value before the accumulator 310 powers down) is A1, the length of the reference clock cycle duration of the reference clock signal CK_Ref is L1, and the length of the sleep period is L2: the controller 302 may first calculate how many reference clock cycles the sleep period spends by taking (L2/L1). Then, the controller 302 may estimate the future accumulated value $\varphi_{Ref}$=A1+2π*Nc* (L2/L1). Another method is to calculate the length L3 of the operating period from 'Reset' of the accumulator 310 (the reset operation performed on the accumulator 310) to the beginning of the wake up period. Then, the controller 302 may estimate the future accumulated value $\omega_{Ref}$=2π*Nc* (L3/L1).

According to an embodiment of the invention, the future accumulated value obtained by the controller 302 is the same as the accumulated value which should be obtained by the accumulator 310 when the accumulator 310 does not power down and keeps functioning till the end of the sleep period. In the embodiment of the invention, since the future accumulated value is written back to the register, when the accumulator 310 powers up again (for example, in response to a power-up control signal), the accumulator 310 can restore the phase information and keep accumulating based on the accumulated value currently stored in the register.

Since the phase information stored in the register can be restored correctly, the phase coherency of the frequency synthesizer circuit will not be affected even when the frequency synthesizer circuit goes to sleep (that is, it powers down) for a sleep period for reducing the power consumption of the communications apparatus.

Figure 7A:
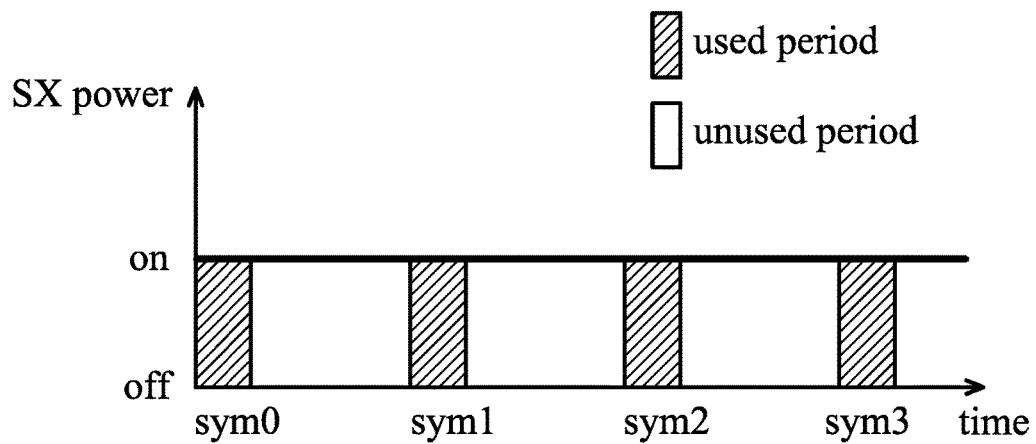
FIG. 7A shows the exemplary power diagram of a conventional frequency synthesizer circuit design.
Figure 7B:
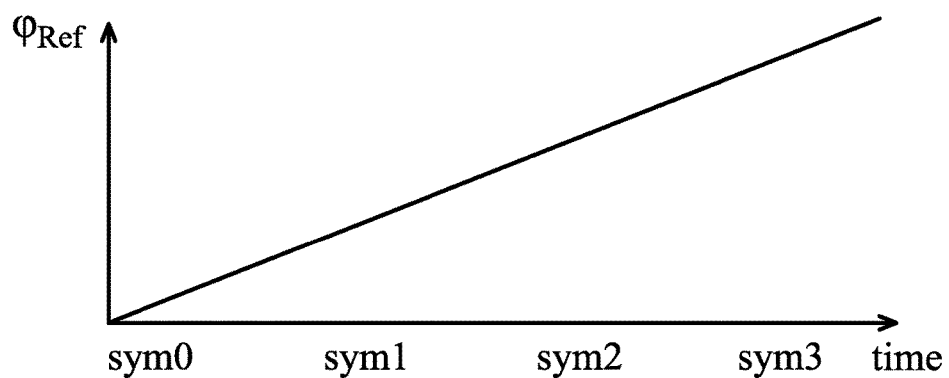
FIG. 7B shows the obtained reference phase $\varphi_{Ref}$ in the conventional design.
Figure 7C:
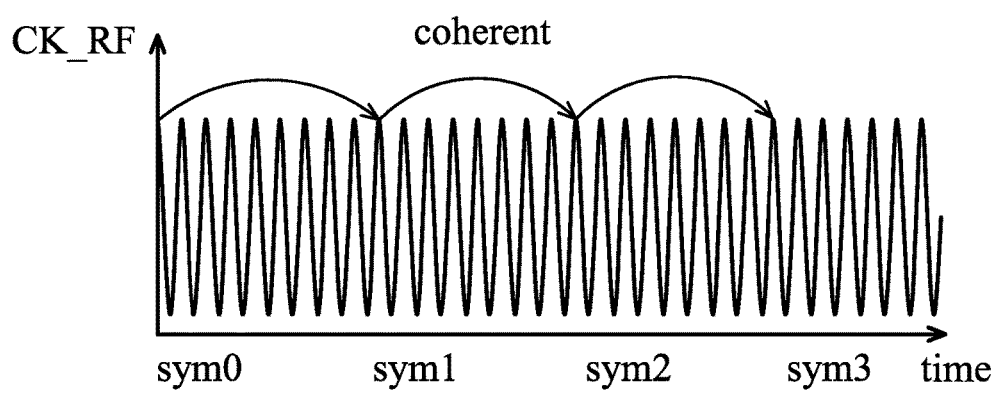
FIG. 7C shows the RF clock signal CK_RF output by the conventional frequency synthesizer circuit.

FIG. 7A shows the exemplary power diagram of a conventional frequency synthesizer circuit design, where the SX power represents the power of the frequency synthesizer circuit and symX represents the X-th symbol in the time domain. FIG. 7B shows the obtained reference phase $\varphi_{Ref}$ in the conventional design. FIG. 7C shows the RF clock signal CK_RF output by the conventional frequency synthesizer circuit.

As shown in FIG. 7A, the frequency synthesizer circuit always powers on and does not go to sleep (that is, does not power down), even when most of the symbols are the unused period and only the symbols 0, 1, 2 and 3 are the used period. As shown in FIG. 7B, the reference phase $\varphi_{Ref}$ can continue being accumulated since the frequency synthesizer circuit does not go to sleep. As shown in FIG. 7C, the phase of the output of the frequency synthesizer circuit is coherent since the frequency synthesizer circuit does not go to sleep.

Figure 8A:
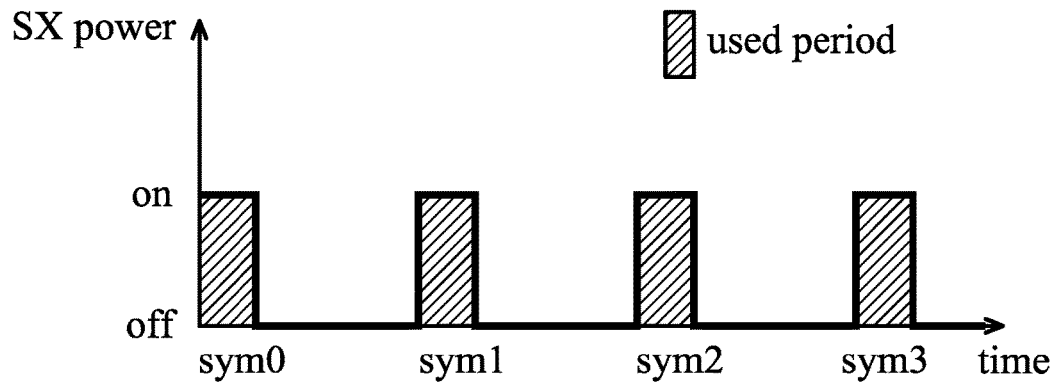
FIG. 8A shows the exemplary power diagram of the proposed frequency synthesizer circuit design according to an embodiment of the invention.
Figure 8B:
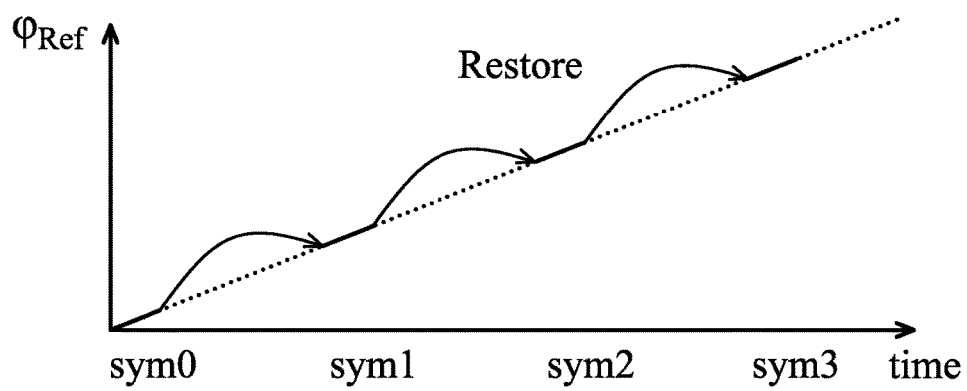
FIG. 8B shows the obtained reference phase $\varphi_{Ref}$ in the proposed design according to an embodiment of the invention.
Figure 8C:
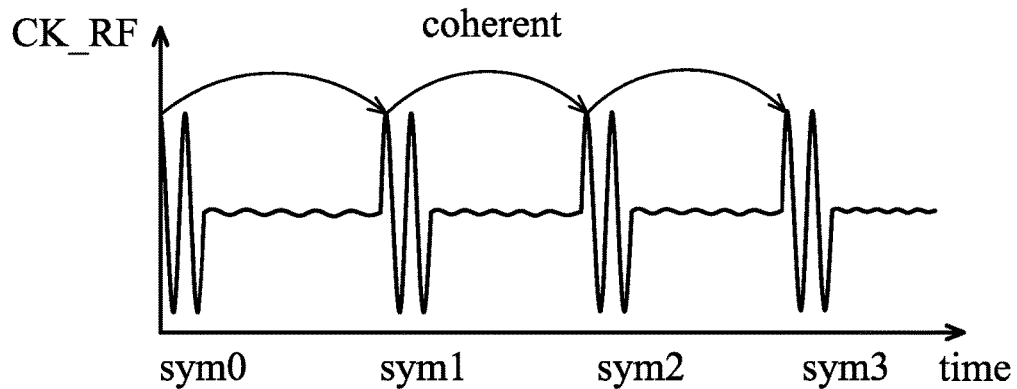
FIG. 8C shows the RF clock signal CK_RF output by the proposed frequency synthesizer circuit according to an embodiment of the invention.

FIG. 8A shows the exemplary power diagram of the proposed frequency synthesizer circuit design according to an embodiment of the invention. FIG. 8B shows the obtained reference phase $\varphi_{Ref}$ in the proposed design according to an embodiment of the invention. FIG. 8C shows the RF clock signal CK_RF output by the proposed frequency synthesizer circuit according to an embodiment of the invention.

As shown in FIG. 8A, the frequency synthesizer circuit only powers on during the used period and powers down in the unused period. Even when the frequency synthesizer circuit powers down, the phase information reference phase $\varphi_{Ref}$ can be restored by the controller 302 and written back to the register of the accumulator 310. As shown in FIG. 8C, the phase of the output of the frequency synthesizer circuit is coherent since the phase information can be correctly restored by the controller 302.

Note that the obtained reference phase $\varphi_{Ref}$ shown in FIG. 7B may also represent the result of the phase information maintained in an embodiment of the first aspect of the invention since in the first aspect of the invention, the accumulator does not power down, and the obtained reference phase $\varphi_{Ref}$ shown in FIG. 8B represents the result of the phase information maintained according to an embodiment of the second aspect of the invention. In addition, FIG. 8A may represent a power diagram of the proposed frequency synthesizer circuit design in the embodiments of both the first and second aspects of the invention, and FIG. 8C may represent the RF clock signal CK_RF output by the proposed frequency synthesizer circuit in the embodiments of both the first and second aspects of the invention.

Figure 9:
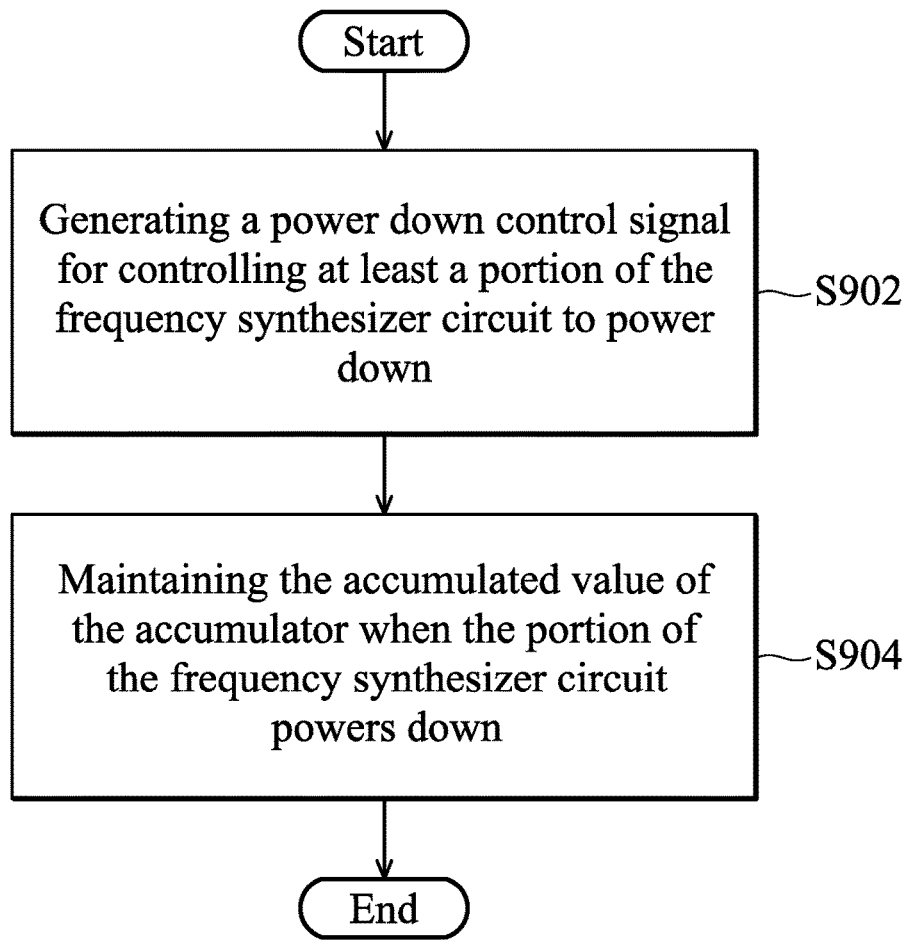
FIG. 9 is a flow chart of a method for controlling a frequency synthesizer circuit comprised in a communications apparatus for reducing power consumption of the communications apparatus without affecting phase coherency of the frequency synthesizer circuit according to an embodiment of the invention.

FIG. 9 is a flow chart of a method for controlling a frequency synthesizer circuit comprised in a communications apparatus for reducing power consumption of the communications apparatus without affecting the phase coherency of the frequency synthesizer circuit according to an embodiment of the invention. First of all, the controller generates a power-down control signal for controlling at least a portion of the frequency synthesizer circuit to power down in a sleep period (Step S902). Next, the controller maintains the accumulated value of the accumulator when the portion of the frequency synthesizer circuit powers down (Step S904).

Figure 10:
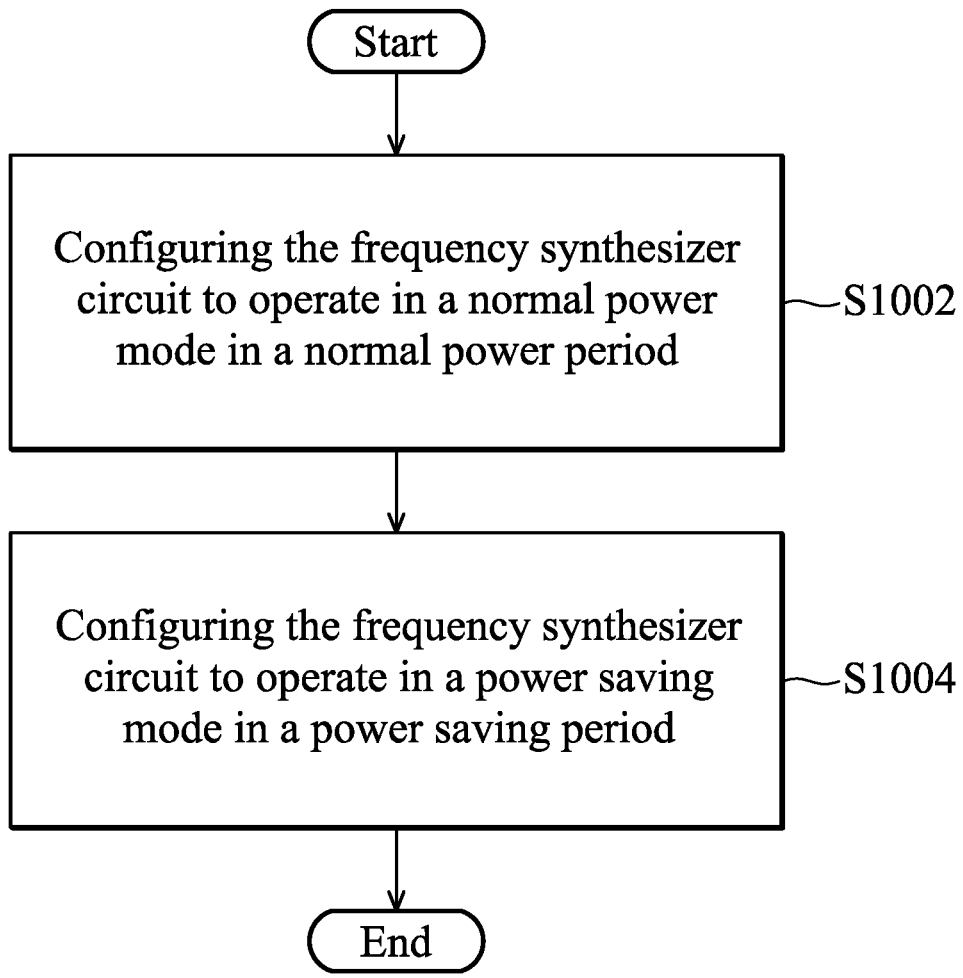
FIG. 10 is a flow chart of a method for reducing power consumption for a communications apparatus having a frequency synthesizer circuit as discussed above according to an embodiment of the invention.

FIG. 10 is a flow chart of a method for reducing power consumption for a communications apparatus having a frequency synthesizer circuit as discussed above according to an embodiment of the invention. First of all, the frequency synthesizer circuit may be configured to operate in a normal power mode in a normal power period (Step S1002). According to an embodiment of the invention, an amount of power consumption of the frequency synthesizer circuit is in a first power level when operating in the normal power period. In an embodiment of the invention, the frequency synthesizer circuit may be configured to operate in the normal power mode by default, and the frequency synthesizer circuit generates and outputs a first clock signal when operating in the normal power mode. Note that the time period when the frequency synthesizer circuit operates in the normal power mode may be regarded as the normal power period.

Next, the frequency synthesizer circuit may be configured to operate in a power saving mode in a power saving period, when required, for reducing power consumption (Step S1004). According to an embodiment of the invention, an amount of power consumption of the frequency synthesizer circuit is in a second power level when operating in the power saving mode, and the second power level is less than the first power level. In addition, according to an embodiment of the invention, the frequency synthesizer circuit does not generate and output the first clock signal when operating in the power saving period. Note that the time period when the frequency synthesizer circuit operates in the power saving mode may be regarded as the power saving period.

For not affecting the phase coherency of the frequency synthesizer circuit, the accumulated value V_acu of the accumulator 310 is maintained as the embodiments discussed above when the frequency synthesizer circuit is operating in the power saving mode.

In the embodiments of the invention, the configuration may be made by the controller 302, the processor 222, or any other devices or methods based on different designs. As an example, according to an embodiment of the invention, the controller 302 in the frequency-generating circuit 300 may generate a power-down control signal for controlling or configuring the frequency synthesizer circuit 301 to operate in the power saving mode when required. In the power saving mode, at least a portion of the frequency synthesizer circuit 301 is powered down (or, shut down) to save the power consumption, and the frequency synthesizer circuit does not generate and output the first clock signal. The controller 302 may further maintain the accumulated value V_acu of the accumulator 310 as the embodiments discussed above when the frequency synthesizer circuit is operating in the power saving mode, for not affecting the phase coherency of the frequency synthesizer circuit.

When there is no need to operate in the power saving mode, the frequency synthesizer circuit may be configured to leave the power saving mode and resume operating in the normal power mode. As an example, according to an embodiment of the invention, the controller 302 in the frequency-generating circuit 300 may generate a power-on control signal for controlling or configuring the frequency synthesizer circuit 301 resume operating in the normal power mode and generate and output a second clock signal. By applying the maintained accumulated value as discussed above, a phase of the second clock signal is coherent to a phase of the first clock signal (e.g. as shown in FIG. 8C, the phase of the output of the frequency synthesizer circuit at symbol 1 is coherent to the phase of the output at symbol 0).

Figure 11:
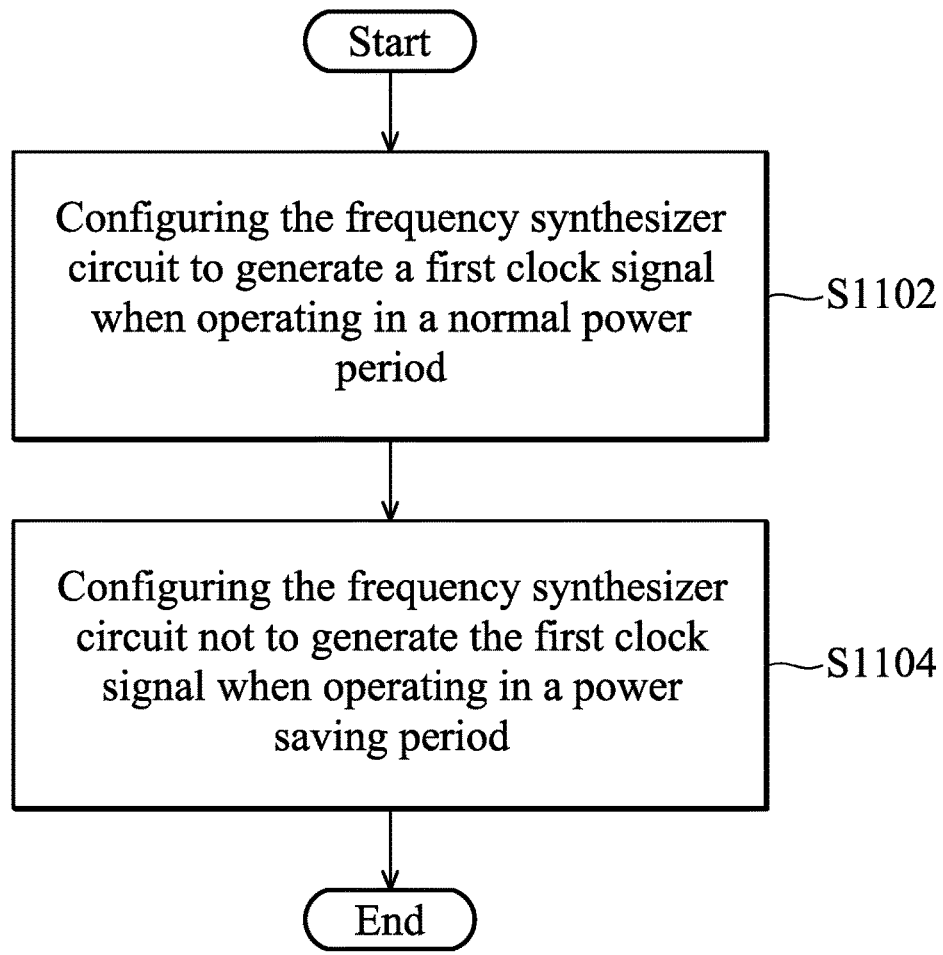
FIG. 11 is a flow chart of a method for reducing power consumption for a communications apparatus having a frequency synthesizer circuit according to another embodiment of the invention.

FIG. 11 is a flow chart of a method for reducing power consumption for a communications apparatus having a frequency synthesizer circuit as discussed above according to another embodiment of the invention. First of all, the frequency synthesizer circuit may be configured to generate a first clock signal when operating in a normal power period (Step S1102). According to an embodiment of the invention, the frequency synthesizer circuit may be configured to operate in a normal power mode by default.

Next, the frequency synthesizer circuit may be configured not to generate the first clock signal when operating in a power saving period, when required, for reducing power consumption (Step S1104).

For not affecting the phase coherency of the frequency synthesizer circuit, the accumulated value V_acu of the accumulator 310 is maintained as the embodiments discussed above when the frequency synthesizer circuit is operating in the power saving period.

When there is no need to operate in the power saving mode, the frequency synthesizer circuit may be configured to leave the power saving mode/period and to generate a second clock signal. Descriptions of the configuration of the frequency synthesizer circuit may refer to the discussion above, and are omitted here for brevity. By applying the maintained accumulated value as discussed above, a phase of the second clock signal is coherent to a phase of the first clock signal.

The embodiments of the present invention can be implemented in any of numerous ways. For example, the embodiments may be implemented using hardware, software or a combination thereof. It should be appreciated that any component or collection of components that perform the functions described above can be generically considered as one or more processors that control the function discussed above. The one or more processors can be implemented in numerous ways, such as with dedicated hardware, or with general-purpose hardware that is programmed using microcode or software to perform the functions recited above.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A frequency-generating circuit, comprising:
    a frequency synthesizer circuit, generating a radio-frequency clock signal according to a reference clock signal and a channel number; and
    a controller, coupled to the frequency synthesizer circuit, generating a power-down control signal for controlling at least a portion of the frequency synthesizer circuit to power down,
    wherein the frequency synthesizer circuit comprises an accumulator for generating an accumulated value according to the channel number, and the frequency synthesizer circuit generates the radio-frequency clock signal according to the reference clock signal and the accumulated value, and
    wherein the controller maintains the accumulated value of the accumulator when the portion of the frequency synthesizer circuit powers down.

2. The frequency-generating circuit as claimed in claim 1, wherein the controller maintains the accumulated value of the accumulator by not providing the power-down control signal to the accumulator for the accumulator to be able to keep functioning while at least one signal-generating circuit of the frequency synthesizer circuit powers down in response to the power-down control signal.

3. The frequency-generating circuit as claimed in claim 1, wherein the controller further provides the power-down control signal to the accumulator for controlling the accumulator to power down in a sleep period.

4. The frequency-generating circuit as claimed in claim 3, wherein the controller maintains the accumulated value of the accumulator by reading a register of the accumulator to obtain a current accumulated value when providing the power-down control signal to the accumulator, estimating a future accumulated value which is supposed to be obtained by the accumulator at the end of the sleep period and writing the future accumulated value back to the register.

5. The frequency-generating circuit as claimed in claim 4, wherein the controller estimates the future accumulated value according to the current accumulated value, a length of a reference clock cycle duration of the reference clock signal and a length of the sleep period.

6. The frequency-generating circuit as claimed in claim 4, wherein the controller estimates the future accumulated value according to a length of a reference clock cycle duration of the reference clock signal and a length of an operating period from reset of the accumulator to beginning of a wake up period of the accumulator.

7. The frequency-generating circuit as claimed in claim 4, wherein the future accumulated value is the same as the accumulated value which should be obtained by the accumulator when the accumulator does not power down and keeps functioning till the end of the sleep period.

8. The frequency-generating circuit as claimed in claim 1, wherein when the frequency synthesizer circuit is a multi modulus divider (MMD) all-digital phase locked loop (ADPLL), the accumulator is a sigma delta modulation (SDM) accumulator in the MMD ADPLL, and when the frequency synthesizer circuit is a MMD-less ADPLL, the accumulator is an integrator in the MMD-less ADPLL.

9. A method for controlling a frequency synthesizer circuit of a frequency-generating circuit comprised in a communications apparatus for reducing power consumption of the communications apparatus, comprising:
    generating a power-down control signal by a controller of the communications apparatus for controlling at least a portion of the frequency synthesizer circuit to power down, wherein the frequency synthesizer circuit comprises an accumulator for generating an accumulated value according to a channel number, and the frequency synthesizer circuit generates a radio-frequency clock signal according to a reference clock signal and the accumulated value; and maintaining the accumulated value of the accumulator by the controller when the portion of the frequency synthesizer circuit powers down.

10. The method as claimed in claim 9, further comprising:
providing the power-down control signal to at least one signal-generating circuit of the frequency synthesizer circuit, and
wherein the step of maintaining the accumulated value of the accumulator comprises:
not providing the power-down control signal to the accumulator for the accumulator to be able to keep functioning while the at least one signal-generating circuit powers down in response to the power-down control signal.

11. The method as claimed in claim 9, further comprising:
providing the power-down control signal to the accumulator for controlling the accumulator to power down in a sleep period.

12. The method as claimed in claim 11, wherein the step of maintaining the accumulated value of the accumulator comprises:
reading a register of the accumulator to obtain a current accumulated value when providing the power-down control signal to the accumulator;
estimating a future accumulated value which is supposed to be obtained by the accumulator at the end of the sleep period; and
writing the future accumulated value back to the register.

13. The method as claimed in claim 12, wherein the future accumulated value is estimated according to the current accumulated value, a length of a reference clock cycle duration of the reference clock signal and a length of the sleep period.

14. The method as claimed in claim 12, wherein the future accumulated value is estimated according to a length of a reference clock cycle duration of the reference clock signal and a length of an operating period from reset of the accumulator to beginning of a wake up period of the accumulator.

15. The method as claimed in claim 12, wherein the future accumulated value is the same as the accumulated value which should be obtained by the accumulator when the accumulator does not power down and keeps functioning till the end of the sleep period.

16. A method for reducing power consumption for a communications apparatus having a frequency synthesizer circuit, comprising:

configuring the frequency synthesizer circuit to operate in a normal power period, wherein an amount of power consumption of the frequency synthesizer circuit is in a first power level when operating in the normal power period;
configuring the frequency synthesizer circuit to operate in a power saving period wherein an amount of power consumption of the frequency synthesizer circuit is in a second power level when operating in the power saving period for reducing power consumption,
wherein the second power level is less than the first power level; and
maintaining an accumulated value of an accumulator of the frequency synthesizer circuit when the frequency synthesizer circuit operating in the power saving period.

17. A method for reducing power consumption for a communications apparatus having a frequency synthesizer circuit, comprising:
configuring the frequency synthesizer circuit to generate a first clock signal when operating in a normal power period;
configuring the frequency synthesizer circuit not to generate the first clock signal when operating in a power saving period for reducing power consumption; and
configuring the frequency synthesizer circuit to generate a second clock signal when leaving the power saving period,
wherein a phase of the second clock signal is coherent to a phase of the first clock signal.

18. A method for reducing power consumption for a communications apparatus having a frequency synthesizer circuit, comprising:
configuring the frequency synthesizer circuit to operate in a normal power period, wherein an amount of power consumption of the frequency synthesizer circuit is in a first power level when operating in the normal power period;
outputting a first clock signal when the frequency synthesizer circuit operating in the normal power period;
configuring the frequency synthesizer circuit to operate in a power saving period wherein an amount of power consumption of the frequency synthesizer circuit is in a second power level when operating in the power saving period for reducing power consumption, wherein the second power level is less than the first power level; and
outputting a second clock signal when the frequency synthesizer circuit leaving the power saving period,
wherein a phase of the second clock signal is coherent to a phase of the first clock signal.

* * * * *